(12) United States Patent
Zhong et al.

(10) Patent No.: US 9,711,612 B2
(45) Date of Patent: Jul. 18, 2017

(54) SEMICONDUCTOR DEVICE STRUCTURE AND METHOD FOR FABRICATING THE SAME

(75) Inventors: Huicai Zhong, Beijing (CN); Qingqing Liang, Beijing (CN); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 1473 days.

(21) Appl. No.: 13/003,969

(22) PCT Filed: Sep. 27, 2010

(86) PCT No.: PCT/CN2010/001497
§ 371 (c)(1),
(2), (4) Date: Jan. 13, 2011

(87) PCT Pub. No.: WO2012/012922
PCT Pub. Date: Feb. 2, 2012

(65) Prior Publication Data
US 2012/0025317 A1    Feb. 2, 2012

(30) Foreign Application Priority Data
Jul. 30, 2010  (CN) .......................... 2010 1 0242704

(51) Int. Cl.
*H01L 29/49* (2006.01)
*H01L 21/768* (2006.01)
(Continued)

(52) U.S. Cl.
CPC .... *H01L 29/4983* (2013.01); *H01L 21/76897* (2013.01); *H01L 21/823437* (2013.01);
(Continued)

(58) Field of Classification Search
CPC .. H01L 21/76897; H01L 27/088; H01L 29/78
(Continued)

(56) References Cited

U.S. PATENT DOCUMENTS 5,783,475 A * 7/1998 Ramaswami ................ 438/303
6,133,098 A   10/2000 Ogura et al.
(Continued)

FOREIGN PATENT DOCUMENTS

CN   101123208 A   2/2008
CN   101207068 A   6/2008

OTHER PUBLICATIONS

International Search Report and Written Opinion dated May 5, 2011, issued by the China Patent Office in related Chinese Patent Application No. PCT/CN2010/001497 (9 pages).
(Continued)

*Primary Examiner* — Kenneth Parker
*Assistant Examiner* — Fang-Xing Jiang
(74) *Attorney, Agent, or Firm* — Osha Liang LLP

(57) ABSTRACT

A semiconductor device structure and a method for fabricating the same. A method for fabricating semiconductor device structure includes forming gate lines on a semiconductor substrate; forming gate sidewall spacers surrounding the gate lines; forming respective source/drain regions in the semiconductor substrate and on either side of the respective gate lines; forming conductive sidewall spacers surrounding the gate sidewall spacers; and cutting off the gate lines, the gate sidewall spacers and the conductive sidewall spacers at predetermined positions, in which the cut gate lines are electrically isolated gates, and the cut conductive sidewall spacers are electrically isolated lower contacts. The method is applicable to the manufacture of contacts in integrated circuits.

14 Claims, 12 Drawing Sheets

(a)

(b)

(51) Int. Cl.
 *H01L 21/8234* (2006.01)
 *H01L 27/02* (2006.01)
 *H01L 27/088* (2006.01)
 *H01L 29/66* (2006.01)
 *H01L 29/78* (2006.01)

(52) U.S. Cl.
 CPC .. *H01L 21/823475* (2013.01); *H01L 27/0207* (2013.01); *H01L 27/088* (2013.01); *H01L 29/66545* (2013.01); *H01L 29/78* (2013.01)

(58) Field of Classification Search
 USPC .................................. 257/351–368; 438/279
 See application file for complete search history.

(56) References Cited

U.S. PATENT DOCUMENTS

| | | | |
|---|---|---|---|
| 6,410,392 B1* | 6/2002 | Sogo | 438/279 |
| 2002/0005553 A1 | 1/2002 | Ootsuka et al. | |
| 2002/0024095 A1* | 2/2002 | Shiozawa et al. | 257/351 |
| 2004/0004259 A1 | 1/2004 | Wu | |
| 2006/0073666 A1 | 4/2006 | Lim et al. | |

OTHER PUBLICATIONS

Office Action issued Jan. 25, 2013, by the State Intellectual Property Office of the People's Republic of China in Chinese Patent Application No. 201010242704.1, with English summary (7 pages).
Second Office Action and Search Report dated Jul. 2, 2013, issued by the State Intellectual Property Office of China, in related Chinese Patent Application No. 201010242704.1, with English translation of the Summary (10 pages).

* cited by examiner

SEMICONDUCTOR DEVICE STRUCTURE AND METHOD FOR FABRICATING THE SAME

FIELD OF INVENTION

The present invention relates to the semiconductor field, and more particularly, to a method for fabricating a semiconductor device structure and a resultant semiconductor device structure, where contacts are formed in a self-aligned manner.

BACKGROUND

Nowadays, Integrated Circuits (ICs) are increasingly scaled down, and feature sizes thereof are becoming smaller and smaller and thus are approaching the theoretical limit of photolithography systems. Therefore, there are typically serious distortions in an image formed on a wafer by a photolithography, that is, Optical Proximity Effects (OPEs) occur. As the photolithography technology is facing more strict requirements and challenges, there has been proposed the Double Patterning Technology (DPT) which is able to enhance photolithography resolutions. In the DPT, a circuit pattern with a high density is divided into two separate patterns with lower densities, which are then respectively printed onto a target wafer.

Hereinafter, the line-and-cut DPT for making the gates in a conventional semiconductor device manufacture process is described with reference to FIGS. 1-3.

Figure 1:
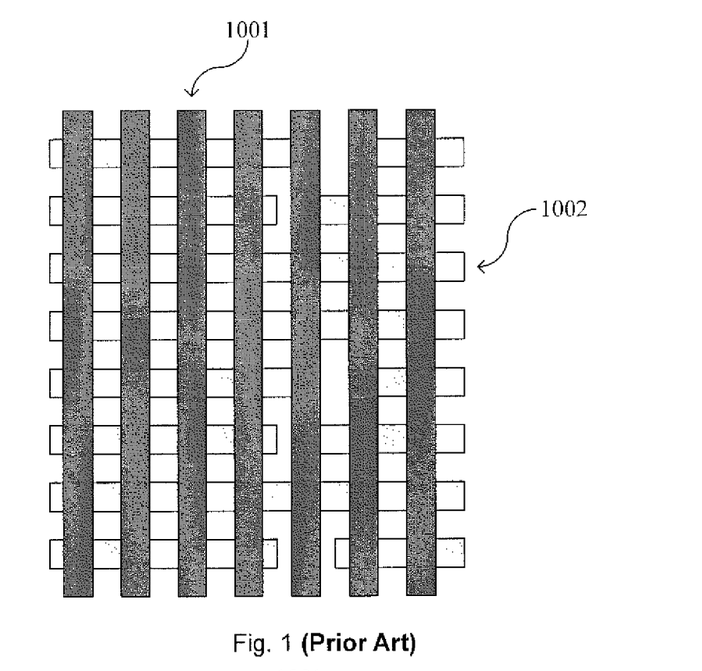
FIGS. 1-3 shows a schematic flow of fabricating a semiconductor device structure according to the prior art.

FIG. 1 shows a part of a layout of devices formed on a wafer. As shown in FIG. 1, a pattern of lines 1001 which is corresponding to the gate pattern to be formed is printed on the wafer by a photo resist coating and then an exposure through a mask. Here, active regions 1002 on the wafer are also shown. The respective lines of the pattern 1001 are printed in parallel in a single direction and have the same or similar pitches and critical dimensions.

Figure 2:
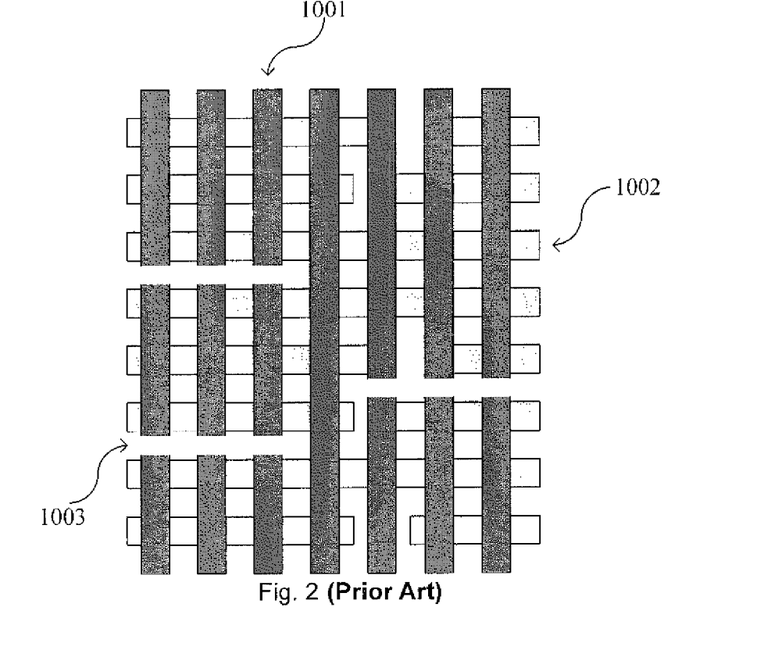

Next, as shown in FIG. 2, cuts 1003 are formed in the pattern of lines 1001 by a further exposure through a cut mask. Thus, in the pattern 1001, gate patterns corresponding to different devices are separated from one another.

Finally, an etching is carried out with the photo resist pattern 1001 having cuts 1003 formed therein to arrive at gate structures corresponding to this pattern.

In the above processes, a single exposure for forming gate patterns is divided into two: one for exposing the pattern of lines 1001, and the other for exposing the cuts 1003. As a result, it is possible to reduce the demand for photolithography and improve the line width control in the photolithography. Further, it is possible to eliminate many proximity effects and thus improve the Optical Proximity Correction (OPC). Furthermore, it is able to ensure a good channel quality and thus guarantee a high mobility for carries in the channels.

Figure 3:
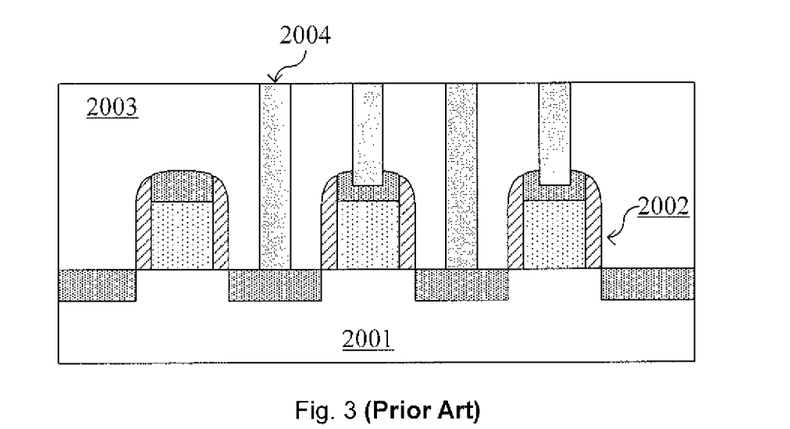

Besides, as shown in FIG. 3, after the formation of gates 2002 on wafer 2001 by etching in the processes described above, it is often desired to form sidewall spacers surrounding the gates. Since there are cuts 1003 in the gate patterns, as shown in FIG. 2, the sidewall spacer material will enter inside the cuts 1003. Thus, the sidewall spacers of respective gate patterns on two opposite ends of a cut 1003 may merge with each other, resulting in defects such as voids in the cut 1003.

As shown in FIG. 3, after the main bodies of devices are formed, a dielectric layer 2003 may also be deposited on the wafer to electrically isolate the respective devices from one another. Thus, the defects such as voids in the cuts 1003 as described above will also cause defects in the formed dielectric layer. Moreover, in order to make contacts to the gates and sources/drains, contact holes corresponding to the gates and sources/drains may be etched in the dielectric layer 2003, and conductive materials such as metals may be filled therein, so as to form contacts 2004.

In this case, all the contacts, including those on the sources/drains and those on the gates, are manufactured by etching the contact holes to their bottoms at one time and then filling the contact holes with conductive materials. This makes a strict demand for the etching of the contact holes. For example, since the etching depth on the gate is different from that on the source/drain, a short is likely to occur between the gate and the contact hole. Further, since the etching on the source/drain is deeper while the corresponding opening is relatively small (that is, the width to height ratio is small), various problems, such as under-etching, generating voids in the filled metals, and the like, are likely to occur. This restricts the selection of manufacture processes and causes greater parasitic resistances as well.

In view of the above, there is a need for a novel semiconductor device structure and a method for fabricating the same.

SUMMARY OF THE INVENTION

It is an object of the present invention to provide a semiconductor device structure and a method for fabricating the same, to overcome the problems in the prior art as described above, and especially, to simplify the formation of contacts.

According to an aspect of the present invention, there is provided a method for fabricating a semiconductor device structure, comprising: forming gate lines on a semiconductor substrate; forming gate sidewall spacers surrounding the gate lines; forming respective source/drain regions in the semiconductor substrate and on either sides of the gate lines; forming conductive sidewall spacers surrounding the gate sidewall spacers; and cutting off the gate lines, the gate sidewall spacers and the conductive sidewall spacers at predetermined positions, wherein the cut gate lines result in electrically isolated gates, and the cut conductive sidewall spacers result in electrically isolated lower contacts.

Preferably, the step of cutting off the gate lines, the gate sidewall spacers and the conductive sidewall spacers comprises: the cutting is performed by reactive ion etching or laser cutting. In the direction of gate width, the distance between adjacent electrically isolated gates is 1-10 nm and the distance between adjacent electrically isolated lower contacts is 1-10 nm.

Alternatively, if there are shallow trench isolations formed in the semiconductor substrate, the positions of cuts are located above the shallow trench isolations.

Preferably, the step of cutting off the gate lines, the gate sidewall spacers and the conductive sidewall spacers is performed after the conductive sidewall spacers are formed and before the front end of line process for the semiconductor device structure is completed.

According to an embodiment of the present invention, after or before the step of cutting off the gate lines, the gate sidewall spacers and the conductive sidewall spacers, the method further comprises: planarizing the semiconductor device structure to expose the top of the conductive sidewall spacers or the lower contacts.

Based on the above solution, preferably, after the conductive sidewall spacers are formed and before the cutting is performed, the method further comprises: removing the gate lines so as to form openings inside the gate sidewall spacers; and forming replacement gate lines in the openings. Alternatively, before the replacement gate lines are formed, the method further comprises: forming a gate dielectric layer in the openings.

Based on the above solution, preferably, the cutting is performed immediately after the conductive sidewall spacers are formed, so as to form the electrically isolated gates and the electrically isolated lower contacts; and the method further comprises: removing the gates so as to form openings inside the gate sidewall spacers. And the method further comprises: forming a gate dielectric layer in the openings.

After the gate lines, the gate sidewall spacers and the conductive sidewall spacers are cut off, the method further comprises: forming an inter-layer dielectric layer on the semiconductor device structure; and forming upper contacts corresponding to the gates and the lower contacts in the inter-layer dielectric layer, wherein the lower contacts face the upper contacts.

According to another aspect of the invention, there is provided a semiconductor device structure, comprising: a semiconductor substrate; at least two transistor structures formed on the semiconductor substrate and arranged along the direction of gate width, each of which comprises: a gate stack formed on the semiconductor substrate, the gate stack including a gate dielectric layer and a gate on the gate dielectric layer; gate sidewall spacers formed only on the lateral surfaces of the gate stack; and lower contacts abutting against the lateral surfaces of the gate sidewall spacers, wherein in the direction of gate width, for adjacent transistors, tops of the gates, tops of the gate sidewall spacers and tops of the lower contacts are flush with each other.

Preferably, in the direction of gate width, the distance between adjacent transistors is 1-10 nm, and the distance between adjacent lower contacts is 1-10 nm. Further, in the direction of gate width, the respective gates are isolated with one another by a dielectric material, and the respective lower contacts are isolated with one another by the dielectric material.

Preferably, the lower contacts and the gate stacks have the same height. The lower contacts serve as conductive contacts between the outside and source/drain regions of the respective semiconductor devices. Preferably, there are upper contacts formed on the gates and the lower contacts, wherein the upper contacts face the lower contacts.

Unlike the prior art where contacts are formed by etching contact holes and then filling conductive materials in the contact holes, the contacts according to embodiments of the present invention are fabricated in the form of sidewall spacers, thereby eliminating the difficulty in forming contact holes as in the prior art. Further, since the lower contacts according to embodiments of the present invention are manufactured in the form of sidewall spacers which are on both sides of a gate sidewall spacer, they are self-aligned to the source/drain regions and therefore can serve as contacts for electrical connections between the source/drain regions of the to semiconductor devices and the outside.

Further, in the present invention, the conductive sidewall spacers (that is, the lower contacts) and the gate stacks may be made to the same height by planarization. This facilitates subsequent processes.

Furthermore, in the present invention, the cut for isolating different devices from one another is carried out after the formation of gate sidewall spacers and conductive sidewall spacers. Therefore, there will be no sidewall spacer material remained in the cuts and thus no defects such as voids as in the prior art. In addition, the conductive sidewall spacers (that is, the contacts) of different devices are completely separated by the cuts, and thus the devices are electrically isolated from one another.

BRIEF DESCRIPTION OF THE DRAWINGS

The above and other objects, features, and advantages of the present invention will be more apparent by describing embodiments thereof in detail with reference to the attached drawings, wherein.

DETAILED DESCRIPTION OF PREFERRED EMBODIMENTS

Hereinafter, the present invention is described with reference to embodiments shown in the attached drawings. However, it is understood that these descriptions are illustrative and not intended to limit the present invention. Further, in the following, well-known structures and techniques are not described to avoid obscuring the concept of the present invention.

In the drawings, various layer-structures according to embodiments of the present invention are shown. However, they are not drawn to scale, and some features may be enlarged while some features may be omitted for purposes of clarity. Moreover, the shapes, sizes, and relative positions of the regions and layers shown in the drawings are also illustrative, and deviations may occur due to manufacture tolerances and technique limitations in practice. Those skilled in the art can also devise regions/layers of other different shapes, sizes, and relative positions as needed.

A First Embodiment

Hereinafter, a first embodiment of the present invention is described with reference to FIGS. 4-10.

Figure 4:
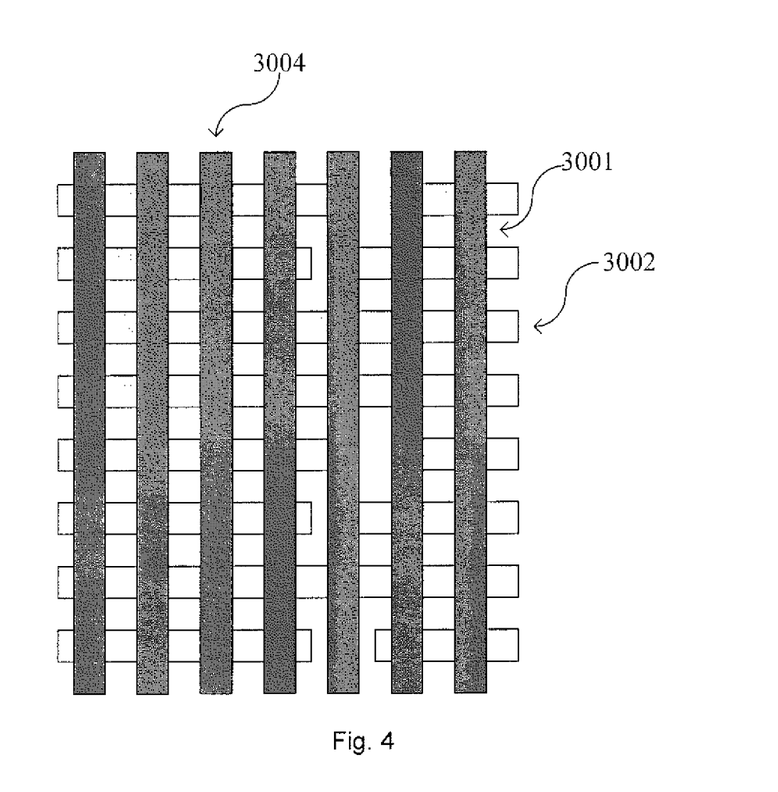
FIGS. 4-10 are schematic diagrams showing device structures during the fabrication of a semiconductor device structure according to a first embodiment of the present invention.

FIG. 4 shows a part of a layout formed on a semiconductor substrate. Here, the semiconductor substrate may comprise any suitable semiconductor substrate materials, for example, but not limited to, Si, Ge, SiGe, SOI (Silicon on Insulator), SiC, GaAs, or any III-V group compound semiconductor, etc. According to known design requirements (for example, for a p-type substrate or an n-type substrate) in the prior art, the semiconductor substrate 1000 may comprise various doping configurations. Further, the semiconductor substrate 1000 may optionally comprise an epitaxial layer which may be manipulated by stress for performance enhancement.

In the semiconductor substrate, Shallow Trench Isolations (STIs) 3001 have already been formed, and active regions 3002 are formed in the areas surrounded by STI structures 3001. For of convenience, FIG. 4 only shows strip-like active regions 3002 and strip-like STI structures 3001. As to the formations of STI structures and active regions, a reference may be made to existing conventional techniques, and the present invention is not limited thereto.

Optionally, a gate dielectric layer 3003 (shown in FIG. 6, but not shown in FIG. 4) may be formed on the semiconductor substrate before the formation of a gate material layer. The gate dielectric layer may comprise, for example, ordinary dielectric materials, such as $SiO_2$, or high-k dielectric materials, such as one or more materials selected from $HfO_2$, HfSiO, HfSiON, HfTaO, HfTiO, HfZrO, $Al_2O_3$, $La_2O_3$, $ZrO_2$, LaAlO, or other materials.

As shown in FIG. 4, a gate material layer is deposited on the semiconductor substrate (or optionally, the gate material layer is deposited on a gate dielectric layer 3003, not shown here). A pattern of lines 3004 which corresponds to the pattern of gate lines to be formed is printed by a photo resist coating and then an exposure through a mask followed by a development. The lines of the pattern 3004 are printed in parallel in a single direction and have the same or similar pitches and critical sizes.

Figure 5:
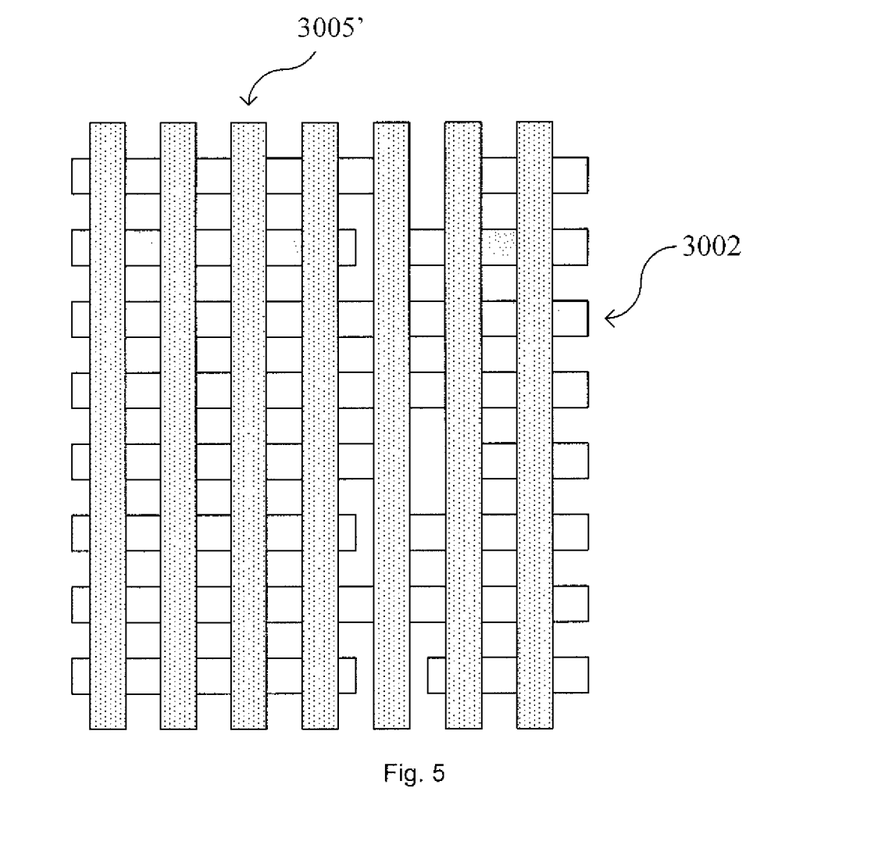
Figure 6:
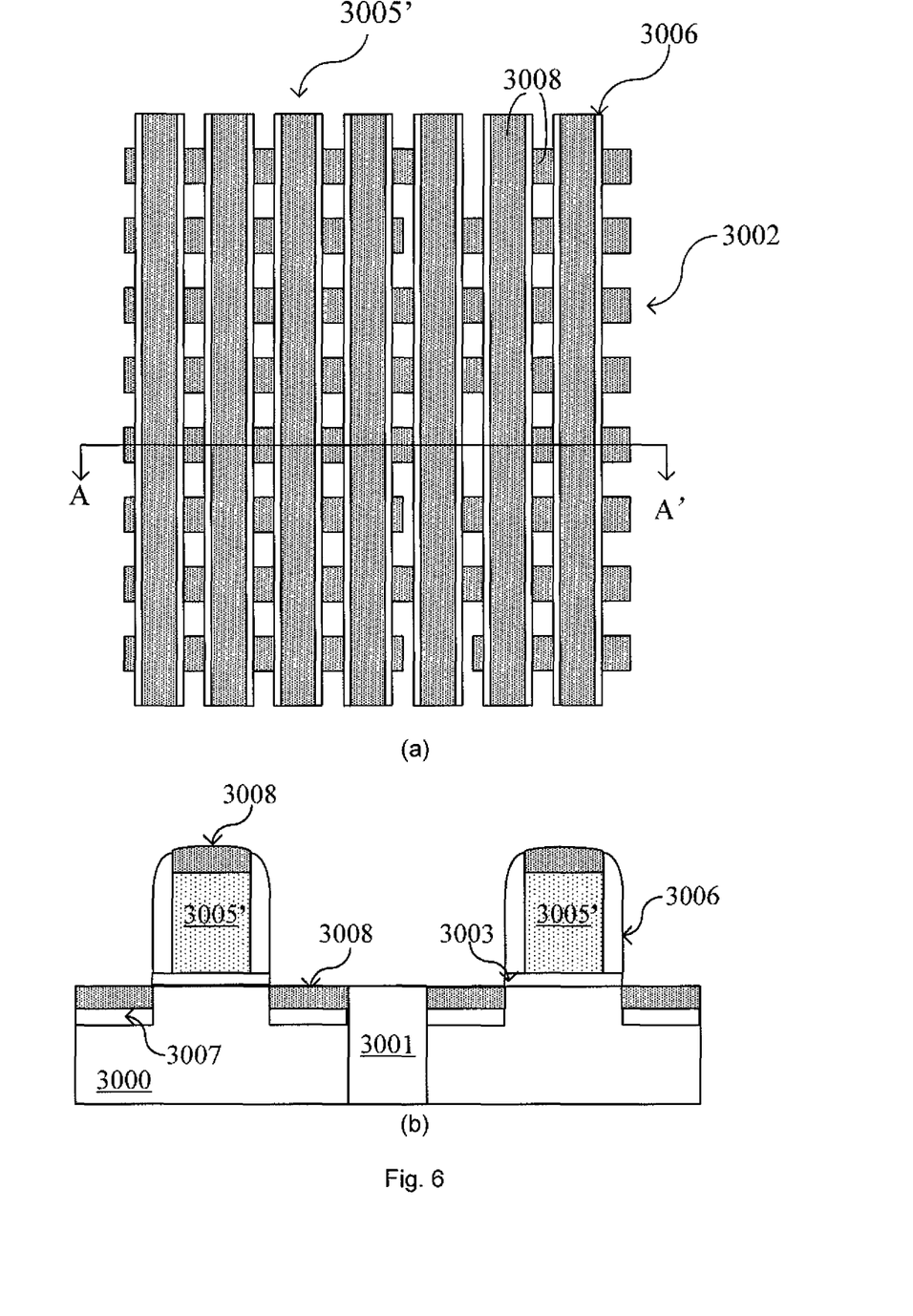
Figure 7:
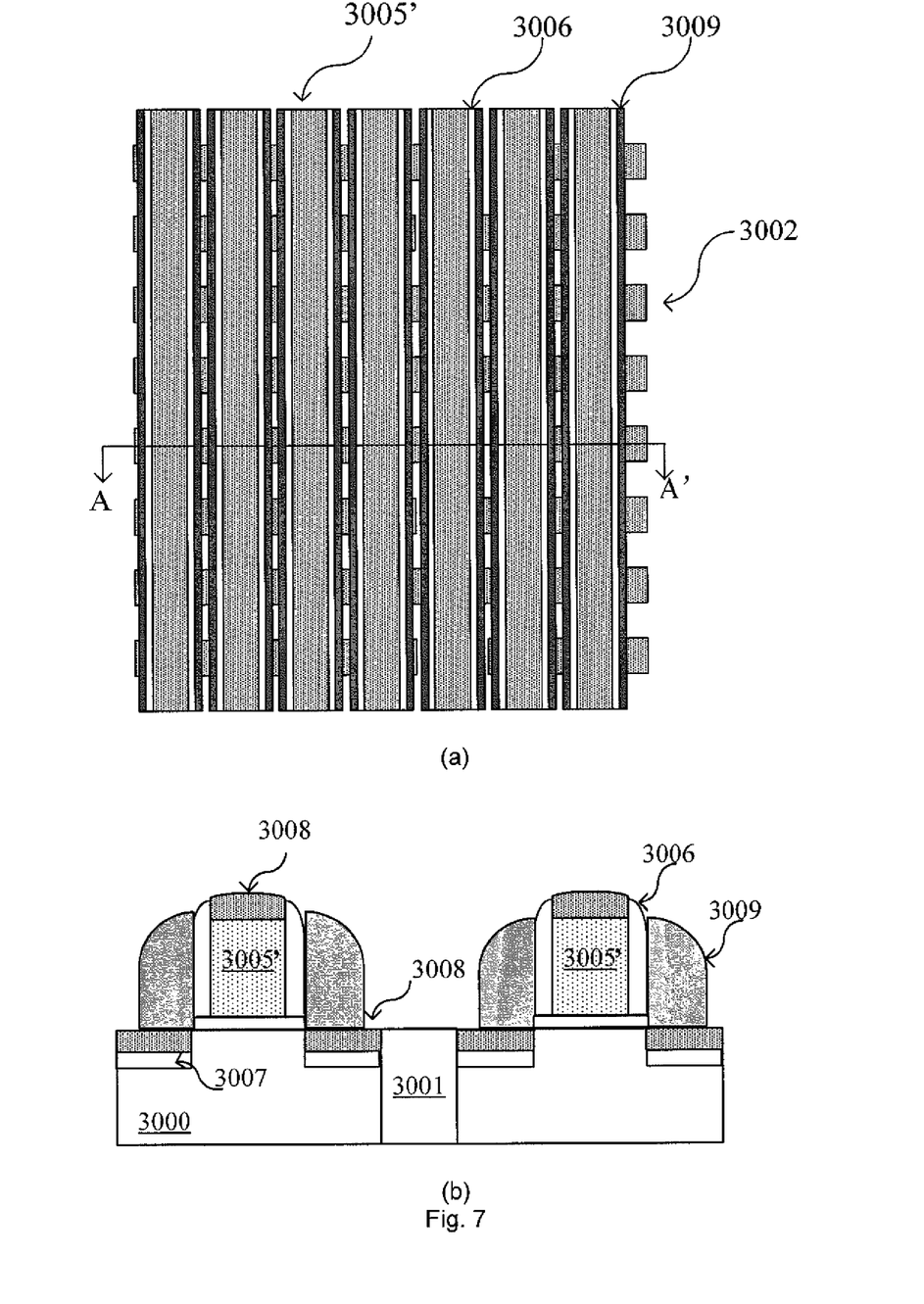

In contrary to the prior art, after the pattern of lines 3004 is formed, a pattern of cuts is not immediately formed using a cut mask. Instead, the gate material layer deposited on the wafer is etched directly using the pattern of lines 3004, so as to form parallel gate lines 3005', as shown in FIG. 5.

After the gate lines 3005' are formed, conventional processes may be conducted in order to fabricate semiconductor devices such as transistors. For example, processes such as ion implantation (to perform doping so as to form, for example, sources/drains), sidewall spacer formation, silicidation, and dual stress liner integration may be carried out, which will be described in detail in the following.

Specifically, as shown in FIG. 6(a), gate sidewall spacers 3006 are formed surrounding the gate lines 3005' (in the drawings, no sidewall spacer is shown on the upper or lower ends of a gate line, but in an actual process, the gate sidewall spacers 3006 are surrounding the gate lines 3005'. For example, the gate sidewall spacers 3006 may be formed by depositing on the entire semiconductor device structure one or more layers of dielectric materials, such as $SiO_2$, $Si_3N_4$, SiON, or other materials, or any combination thereof, and then conducting a Reactive Ion Etching (RIE, to selectively etch the dielectric materials with respect to Si) thereon.

After the sidewall spacers 3006 are formed, it is possible to carry out an etching along the sidewall spacers to remove the gate dielectric layer 3003 located outside the sidewall spacers.

Further, source/drain regions 3007 may be formed beside the respective gates in the substrate 3000 by ion implantation doping. Optionally, before the gate sidewall spacers are formed, source/drain extension regions and Halo regions (not shown) may be formed by tilted ion implantations.

Optionally, the source/drain regions 3007 and the gate lines 3005' may be subjected to silicidation to form a metal silicide layer 3008. The silicide may be formed by: depositing a metal layer, such as W, Co, and Ni, on the entire semiconductor device structure; conducting anneal at a high temperature to make the semiconductor material (Si in this embodiment) react with the metal so as to form the silidice; and finally removing the unreacted metal. FIG. 6(b) shows a part of a section view taken along the arrows shown in FIG. 6(a), where only two gate stacks are shown for convenience.

Here, it should be noted that the above processes (such as ion implantation, sidewall spacer formation, and silicidation) for fabricating the semiconductor devices are not directly relevant to the subject matter of the invention, and thus will not be described in detail here. They may be implemented by conventional processes or by future developed processes, and the present invention is not limited thereto.

Next, as shown in FIG. 7(a), conductive sidewall spacers 3009 may be formed by surrounding the gate sidewall spacers 3006 described above with conductive materials, such as W, TiN, TaN, Al, TiAl, Co, or other materials (in the drawings, again no conductive sidewall spacer is shown on the upper or lower ends of the gate lines, but in actual, the conductive sidewall spacers 3009 are surrounding the gate sidewall spacers). The conductive sidewall spacers 3009 may be made, for example, as follows. A conductive material layer is conformally deposited on the substrate (wafer). Then, the deposited conductive material layer is selectively etched to remove the portions parallel to the substrate (wafer) surface, leaving only portions perpendicular to the substrate (wafer) surface. Thereby, the conductive sidewall spacers 3009 are formed. Obviously, those skilled in the art can recognize other ways for manufacturing the conductive sidewall spacers 3009 as well as the above described gate sidewall spacers 3006.

FIG. 7(b) shows a part of a section view taken along the arrows shown in FIG. 7(a), where only two gate stacks are shown for convenience. As shown in FIG. 7(b), the conductive sidewall spacers 3009 formed by the method described above are self-aligned on the source/drain regions 3007 of the semiconductor device, and thus may serve as lower contacts for electrical connections between the source/drain regions and the outside.

Subsequently, as shown in FIG. 8(a), the gate lines 3005', together with the surrounding gate sidewall spacers 3006 and the surrounding conductive sidewall spacers 3009, are cut off at predetermined positions according to the design, to achieve electrical isolation between the respective gates and thus achieve electrical isolation between the respective devices. In general, the cuts are made above the STIs 3001, with a cut width of about 1-10 nm. The cutting may be implemented, for example, by RIE, a laser cutting etch, etc. with the use of a cut mask. For instance, if the cutting is done by an etching, a photo resist may be coated on the substrate (wafer) and then patterned by the cut mask so that predetermined regions corresponding to the cuts to be formed are exposed. Then, the exposed portions of the gate lines 3005' as well as their surrounding sidewall spacers 3006 and surrounding conductive sidewall spacers 3009 are cut off, so as to form the cuts 3010. As a result, the cut gate lines 3005 result in electrically isolated gates 3011, and the cut conductive sidewall spacers 3009' result in electrically isolated contacts 3012. Here, the cuts 3010 are positioned above the STIs 3001.

FIG. 8(b) shows a part of a section view taken along the arrows shown in FIG. 8(a), where only two gate stacks are shown for convenience. As shown in FIG. 8(b), an inter-layer dielectric layer 3013 may be formed on the entire semiconductor device structure. The inter-layer dielectric layer 3013 also fills up the cuts 3010 formed by the above cutting process, so that the gates 3011 are isolated from the lower contacts 3012.

According to another embodiment of the present invention, it is feasible to form the inter-layer dielectric layer 3013 before cutting the gate lines, the gate sidewall spacers and the conductive sidewall spacers. It is also capable of accomplishing the present invention.

Figure 9:
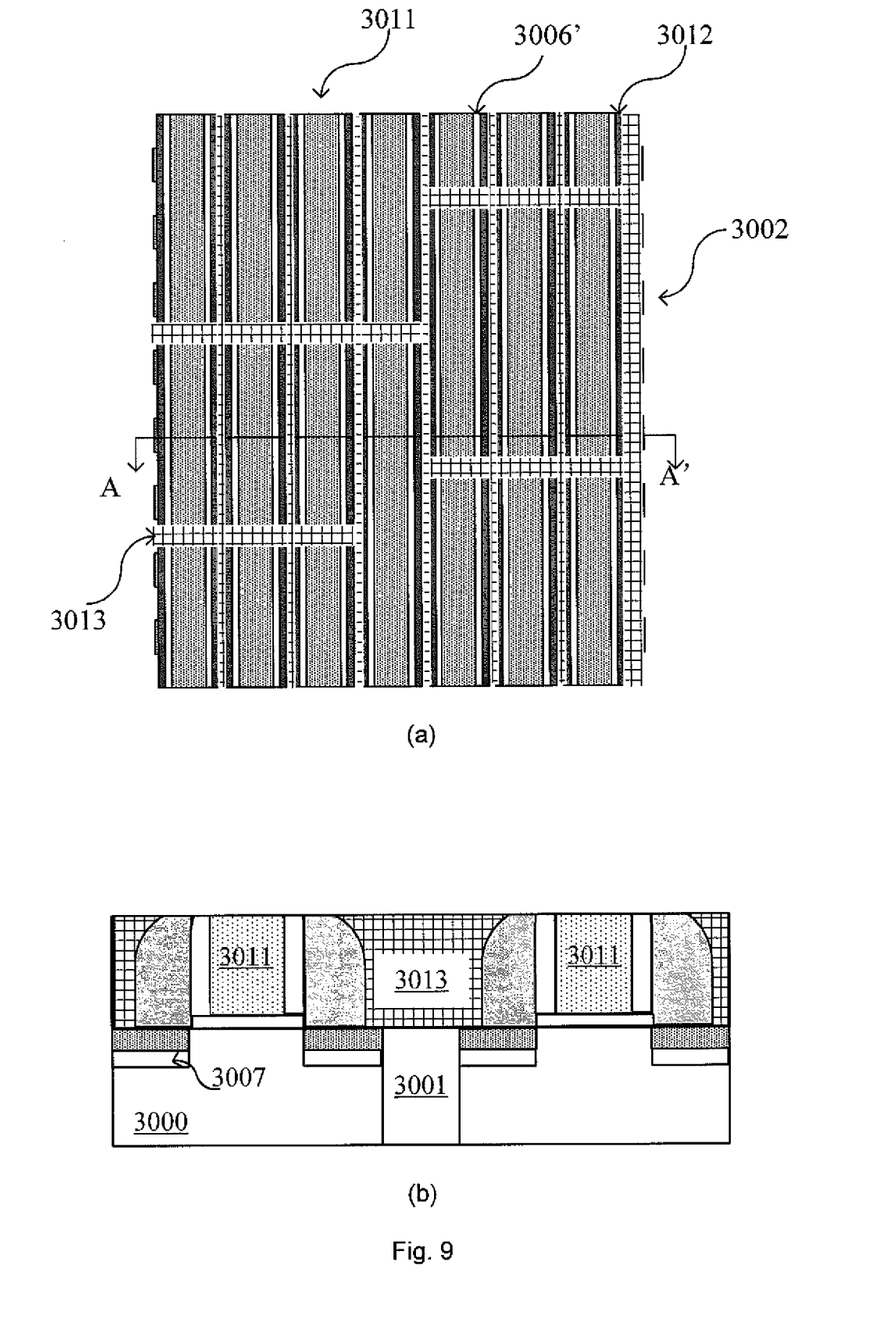

Finally, referring to FIGS. 9(a) and 9(b), a semiconductor device according to one embodiment of the present invention is shown, wherein FIG. 9(a) is a top view and FIG. 9(b) shows a part of a section view taken along the arrows shown in FIG. 9(a), where only two gate stacks are shown for convenience. As shown in FIG. 9, the semiconductor device comprises a plurality of transistor structures formed on a semiconductor substrate, and there are at least two arranged in the gate width direction (that is, the vertical direction in FIG. 9(a), and the direction perpendicular to the sheet in FIG. 9(b)). Each of the transistor structures comprises: a gate stack formed on the semiconductor substrate, the gate stack comprising a gate dielectric layer 3003 and a gate 3011 on the gate dielectric layer; gate sidewall spacers 3006 formed only on the lateral surfaces of the gate stack (there is no gate sidewall spacer on the upper or lower ends of the gate stack due to the cutting process); and contacts 3012 abutting against the lateral surfaces of the gate sidewall spacers 3006. Here, in the gate width direction, for adjacent transistors, ends of the gates 3011, ends of the gate sidewall spacers 3014, and ends of the lower contacts 3012 are flushed with each other.

On both sides of the gates 3011, there are the source/drain regions 3007 and also the metal silicides 3008 on the source/drain regions 3007.

Preferably, in the direction of gate width, for adjacent devices, the distance between the gates 3011 and the distance between the lower contacts 3012 are 1-10 nm.

Preferably, in the direction of gate width, the respective gates 3011 are isolated from one another by dielectric materials (for example, the inter-layer dielectric layer 3013), and so are the respective lower contacts 3012.

Preferably, according to an embodiment of the present invention, the lower contacts 3012 have the same height the gate stacks and serve as conductive contacts between the source/drain regions of the semiconductor devices and the outside.

To obtain a completed device, it is needed to form upper contacts for the gates and the source/drain regions. In this case, the devices need to be further polished. As shown in FIG. 9, the entire semiconductor device structure may be subjected to a Chemical Mechanical Polishing (CMP) process until the top of the lower contacts 3012 is exposed. In FIG. 9, it is shown that the CMP process also removes the silicide layer on the top of the gate stacks. However, in practice, the silicide layer may remain on the top of the gate stacks.

Figure 10:
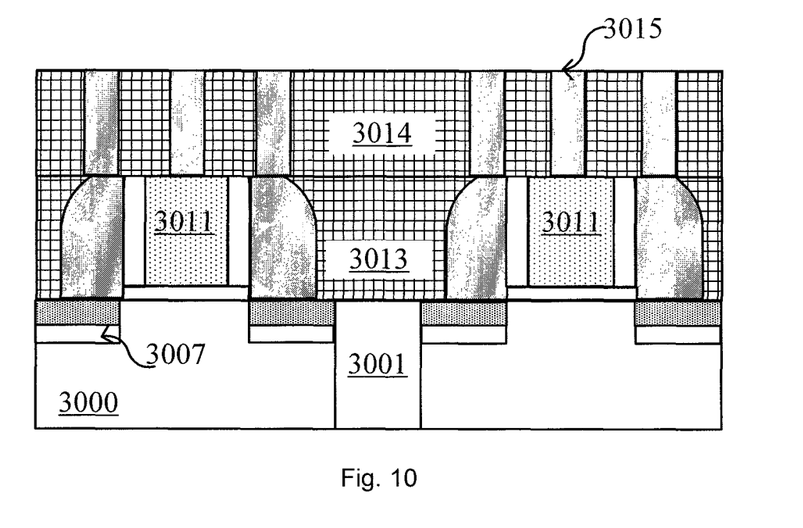
Figure 11:
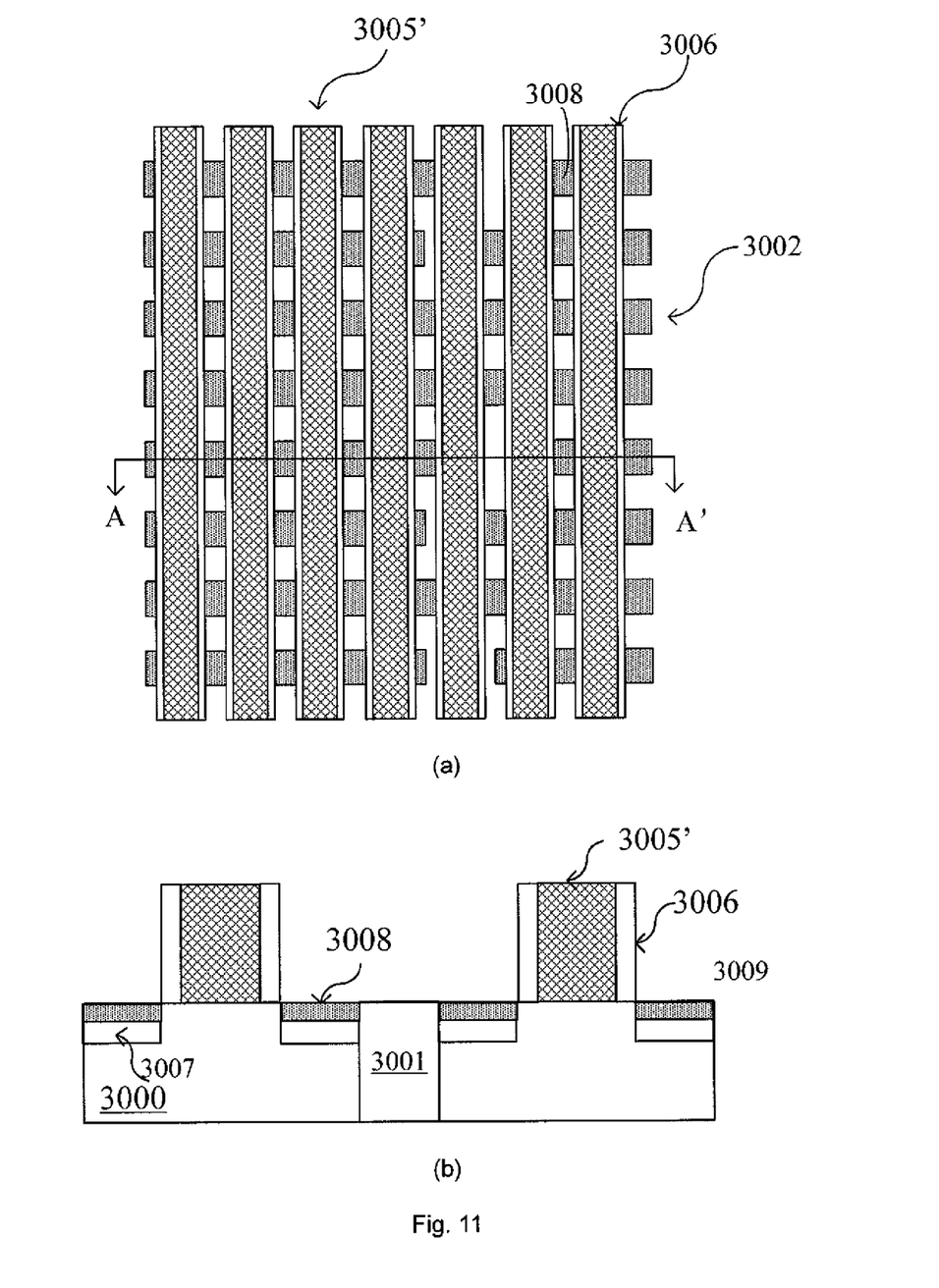
FIGS. 11-15 are schematic diagrams showing device structures during the fabrication of a semiconductor device structure according to a second embodiment of the present invention.
Figure 12:
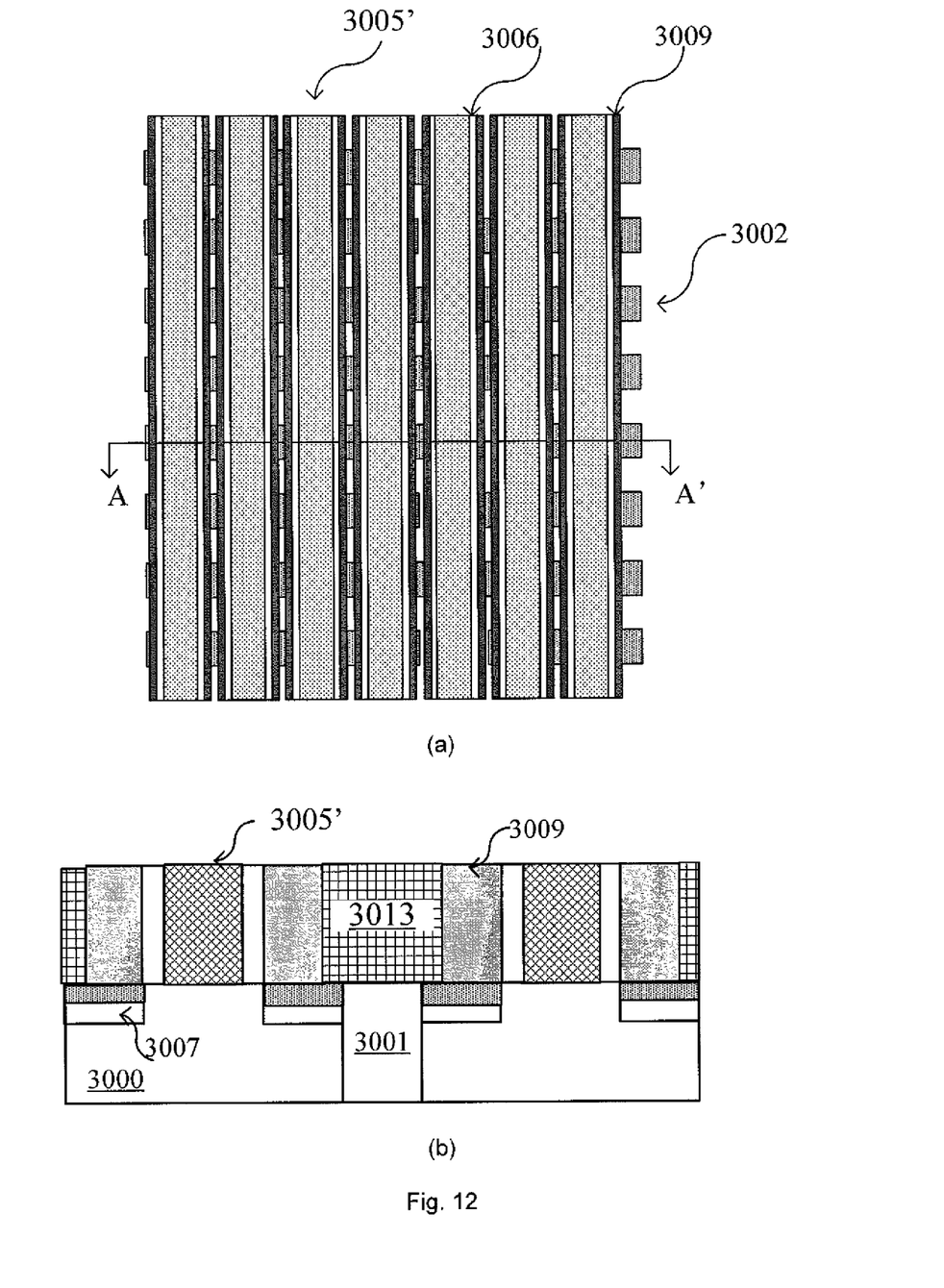

Next, as shown in FIG. 10, a further inter-layer dielectric layer 3014 is deposited on the entire semiconductor device structure and then polished by a CMP process. Then, upper contacts 3015 are formed on the gates 3011 and on the lower contacts 3012 for the source/drain regions 3007. On the source/drain regions 3007, the lower contacts 3012 are aligned with the upper contacts 3015 so that electrical contacts are achieved.

A Second Embodiment

The method according to the present invention is also compatible with the replacement gate process. Hereinafter, a second embodiment of the present invention is described with reference to FIGS. 11-15, where the replacement gate process in incorporated in this embodiment. The second embodiment differs from the first embodiment mainly in that: a replacement gate process is conducted after the source/drain regions are formed. Specifically, dummy gate lines are firstly formed and then are replaced with replacement gate lines. The same or similar reference numbers in the drawings and in the first embodiment denote corresponding parts.

In the following, emphasis is given to the differences of the second embodiment from the first embodiment and description of the same processes is omitted. Like reference numbers denote like parts throughout the drawings.

As shown in FIG. 11(a), dummy gate lines 3005' are formed by printing a pattern of parallel gate lines and then carrying out an etching, which is the same as in the first embodiment. Usually, the dummy gate lines 3005' are made of poly silicon. Then, the process continues as conventional to form the semiconductor device structure. For example, source/drain regions 3007 may be formed into the semiconductor substrate at both sides of the respective dummy gate lines 3005', gate sidewall spacers 3006 may be formed to surround the dummy gate lines 3005', and a metal silicide layer 3008 may be formed on the source/drain regions 3007. Here, a pattern of active regions 3002 on the semiconductor substrate is also shown.

FIG. 11(b) shows a part of a section view taken along the arrows shown in FIG. 11(a), where only two gate stacks are shown for convenience. As shown in FIG. 11(b), in this embodiment, the dummy gate lines 3005' are made of poly silicon and thus have no metal silicide layer thereon.

Next, as shown in FIGS. 12(a) and 12(b), conductive sidewall spacers 3009 are formed to surround the gate sidewall spacers 3006. The conductive sidewall spacers 3009 are self-aligned with the source/drain regions of the semiconductor devices and thus can serve as contacts for electrical connections between the source/drain regions and the outside.

Optionally, as shown in FIG. 12(b), after the formation of conductive sidewall spacers 3009, an inter-layer dielectric layer 3013 between the devices may be formed (for example, deposited) on the semiconductor substrate and then be planarized. For example, the inter-layer dielectric layer may be a stressnitride layer.

Figure 13:
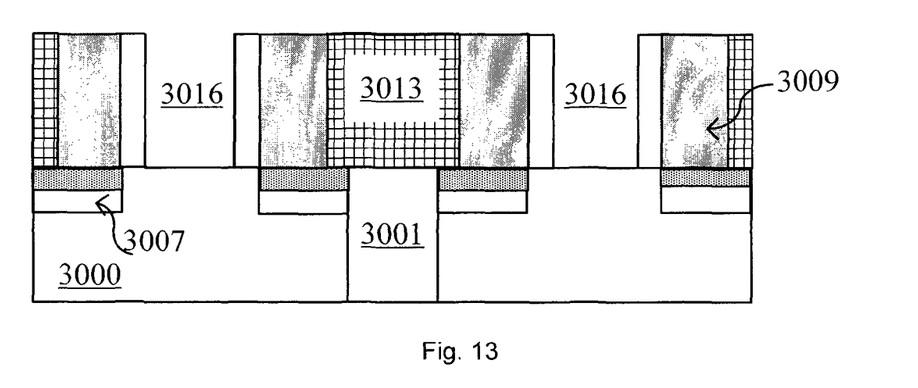

Subsequently, a replacement gate process may be conducted. As shown in FIG. 13, the dummy gate lines 3005' are removed by, for example, an etching, so as to form an opening 3016 between a pair of gate sidewall spacers 3006.

Figure 14:
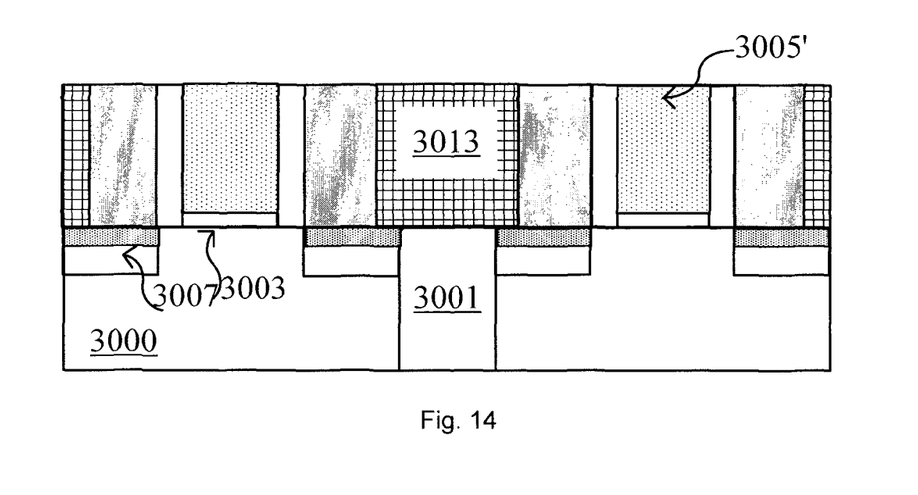

Next, as shown in FIG. 14, replacement gate lines 3005' are formed in the openings 3016. If a gate dielectric layer is not formed on the semiconductor substrate in advance, a gate dielectric layer 3003, for example, a high-k dielectric layer, may be formed in the openings before the formation of replacement gate lines. After that, the replacement gate lines 3005' are formed. Those skilled in the art can conceive to various ways to implement such a gate line replacement process.

Alternatively, the replacement gate process may be conducted before forming the inter-layer dielectric layer 3013.

Preferably, a planarization process, for example, CMP, may be performed after the formation of replacement gate lines 3005', so as to make the replacement gate lines 3005' have the same height as the conductive sidewall spacers 3009, which will facilitate subsequent processes.

Figure 8:
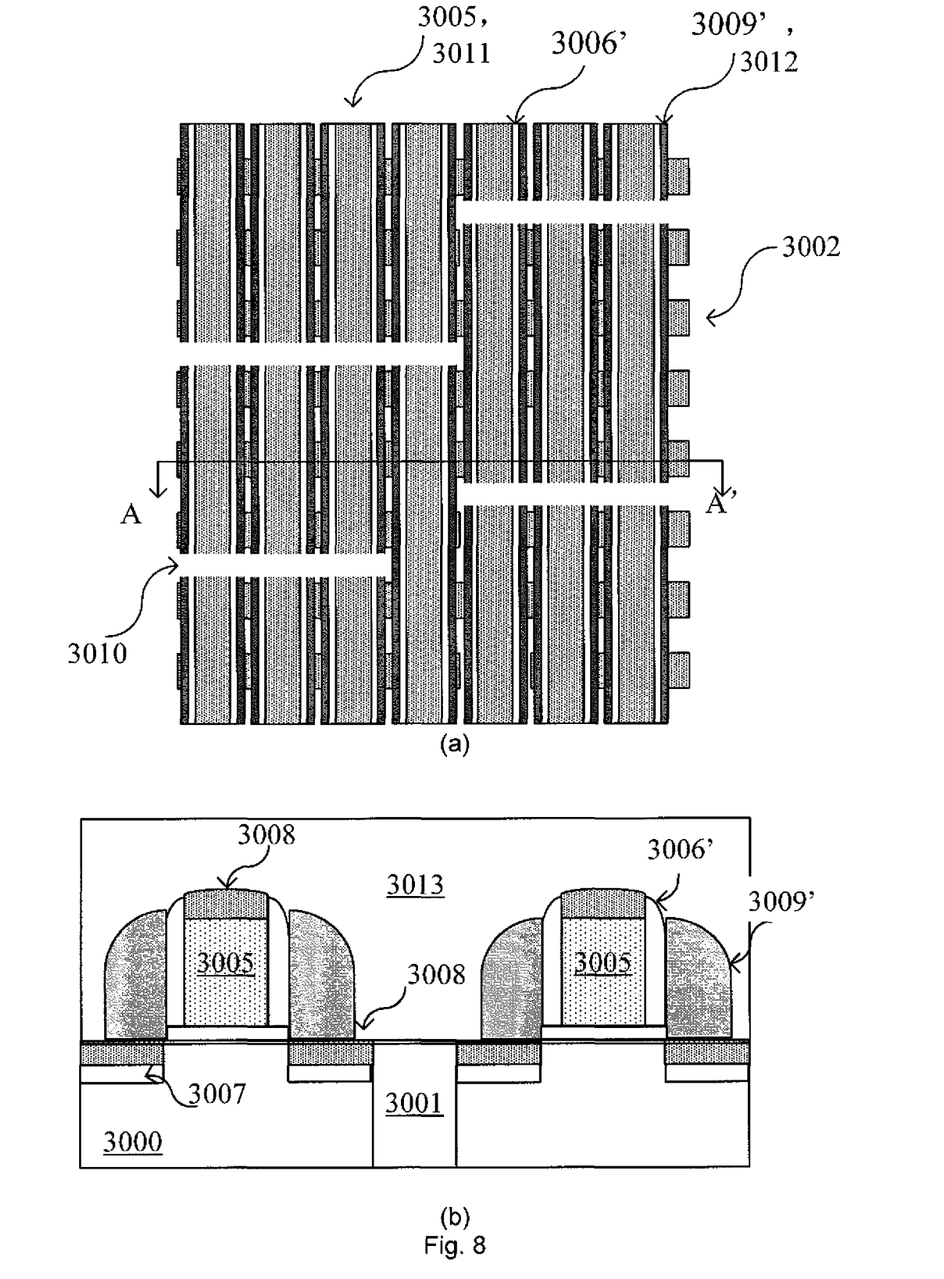

Then, referring to the process described with reference to FIG. 8, the gate stacks 3005', the gate sidewall spacers 3006, and the conductive sidewall spacers 3009 are cut off at predetermined positions by using a cut mask, so as to achieve electrical isolation between devices. After the cutting process, cuts 3010 are formed in the gate stacks 3005', the gate sidewall spacers 3006, and the conductive sidewall spacers 3009. The cut gate lines 3005' result in gates 3011, and the cut conductive sidewall spacers 3009 result in lower contacts 3012. The lower contacts 3012 can serve as a portion of contacts for the source/drain regions.

Figure 15:
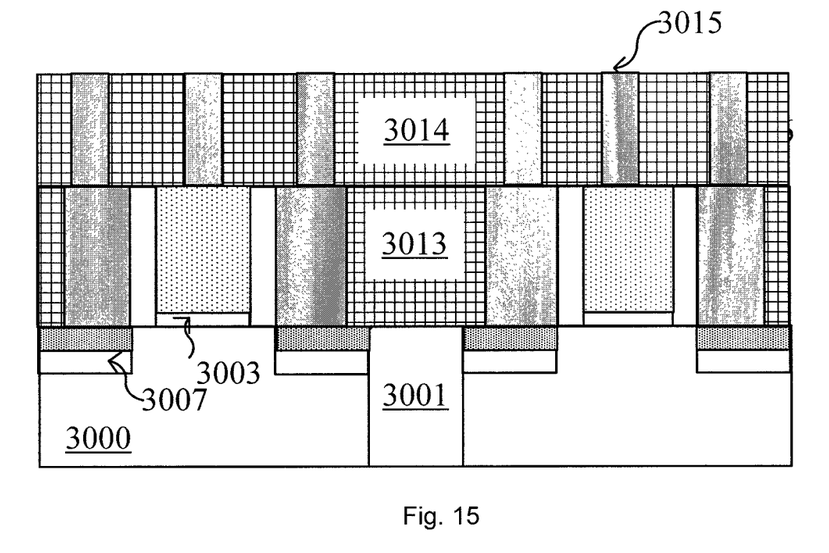

To complete the front end of line (FEOL) process, it is necessary to further fabricate complete contacts. As shown in FIG. 15, a further inter-layer dielectric layer 3014 is deposited on the inter-layer dielectric layer 3013, and upper contacts 3015 are formed therein. On the gate stacks, the upper contacts 3015 correspond to and in contact with the gates 3011. On the source/drain regions, the upper contacts 3015 correspond to and in contact with the lower contacts 3012. Therefore, the contacts to the gate regions and the source/drain regions are realized. If there are some unfilled gaps in the cuts 3010, they will be further filled up after depositing the further inter-layer dielectric layer 3014. Thus, the gates 3011 arranged in the gate width direction can be further electrically isolated, and the lower contacts 3012 arranged in the gate width direction can also be further electrically isolated. In this embodiment, it is clear from FIG. 15 that, in the forming of upper contacts 3015, the etching depths of the upper contacts on the gate regions and the source/drain regions are the same. Thus, it is possible to simplify the etching process.

Here, it should be noted that, although the replacement gate process is conducted before the cutting process in the above described embodiment, the present invention is not limited to it. It is also feasible to conduct the cutting process before the replacement gate process. For example, the dummy gate lines 3005' may be cut off immediately after the conductive sidewall spacers 3009 are formed so as to form electrically isolated gates 3011 and electrically isolated contacts 3012. Then, the replacement gate process is conducted to form the replacement gates. In a word, the sequences of the steps in various embodiments of the present invention are not limited to those described in the above embodiment.

According to embodiments of the present invention, the cutting of the gate lines, the gate sidewall spacers, and the conductive sidewall spacers may be performed anytime after the conductive sidewall spacers are formed, so as to finally complete the FEOL process for the semiconductor device structure.

The gate sidewall spacers and the conductive sidewall spacers shown in FIGS. 11-15 are all in a shape of "I", which are different from those in a shape of "D" in the first embodiment. The "I" shaped sidewall spacers have a benefit that they have the same height as the gate stacks so that a CMP polishing as shown in FIG. 10 is unnecessary before concurrently forming the upper contacts on the gates and the source/drain regions. Thus, the cost can be reduced. In the following, a method for forming "I" shaped sidewall spacers is explained, taking a formation of ordinary gate sidewall spacers for an example. A method for forming normal gate sidewall spacers may be as follows: firstly, a very thin protective layer of dielectric material, such as $SiO_2$, is formed on the entire semiconductor device structure; then, a thicker layer of dielectric material, such as $Si_3N_4$, is formed, with a thickness of about 40-50 nm; and finally, the $Si_3N_4$ layer is selectively etched by RIE so as to form gate sidewall spacers surrounding the gates. In contrary, in forming "I" shaped sidewall spacers, after the thicker dielectric layer is formed, a further very thin layer of dielectric material, which may also be $SiO_2$, is formed on the thicker dielectric layer, with a thickness of about 3 nm. Then, the uppermost layer of $SiO_2$ is subjected to RIE so as to form a very thin protective layer for $Si_3N_4$ conformal to the respective gates. Next, the $Si_3N_4$ layer is further selectively etched. Since the portion of the $Si_3N_4$ layer adjacent to the gate are protected by the $SiO_2$ protective layer, the $Si_3N_4$ layer will not suffer from lateral losses, resulting in an "I" shaped sidewall spacer.

In the case where the I shaped sidewall spacers are formed, it is possible to not perform CMP polishing, and it is also possible to directly deposit the dielectric layer 3014 without depositing the dielectric layer 3013 and then form upper contacts in the dielectric layer 3014. Such processes are also capable of accomplishing the present invention.

As described above, according to embodiments of the present invention, the pattern of parallel gate lines, after being printed on the substrate (wafer), will not be cut off immediately by using a cut mask as in the prior art. In contrary, the pattern of parallel gate lines is directly used in gate lines etching. Subsequently, processes for forming the semiconductor device structure are performed. Then, by surrounding the gates, more specifically, by surrounding the gate sidewall spacers, contacts to source/drain are formed in a self-aligned manner in a form of sidewall spacer. Finally, the gates and the contacts in a form of sidewall spacer are both cut off by using a cut mask, so as to achieve electrical isolation between devices.

Therefore, according to the present invention, the gate pattern is cut off at a later stage so that the ends of a pair of opposing gates can be closer to each other. Further, in the present invention, the cutting process is conducted to isolate the devices from one another after the formation of gate sidewall spacers and conductive sidewall spacers. Therefore, there will be no sidewall spacer materials remained in the cuts, and there will be no defects, such as voids, as in a conventional process. In to addition, the conductive sidewall spacers (that is, the contacts) for respective devices are entirely cut off by the cuts, and thus it is possible to achieve good electrical isolation between the devices.

Further, unlike the prior art where contacts are formed by etching contact holes and then filling the contact holes with conductive materials, according to embodiments of the invention, the contacts are formed in a form of sidewall spacer, thus eliminating the difficulty in forming contact holes in the prior art. Also, such contacts in a form of sidewall spacer are self-aligned on the source/drain regions, and therefore the process is dramatically simplified. At the same time, it is impossible to form such self-aligned contacts in a form of conductive sidewall spacer according to conventional processes. This is because in conventional processes, the sidewall spacer formation process is conducted after the cuts are formed. In this case, during the formation of sidewall spacers, especially, during the forming of conductive sidewall spacers, conductive materials may enter into the cuts. This will possibly cause the respective conductive sidewall spacers of a pair of opposing gates not to be completely isolated from each other, and thus the corresponding devices will electrically contact with each other.

Furthermore, the present invention is compatible with a replacement gate process. Thus, it is possible to have various options for process.

Moreover, in the present invention, the conductive sidewall spacers (that is, the contacts) and the gate stacks may be made to have the same height by, for example, a planarization process. This facilitates the subsequent processes.

In the above description, details of patterning and etching of the layers are not described. It is understood by those skilled in the art that various measures in the prior art may be utilized to form the layers and regions in desired shapes. Further, to achieve the same feature, those skilled in the art can devise processes not entirely the same as those described above.

The present invention is described above with reference to embodiments thereof. However, these embodiments are provided just for illustrative purposes, rather than limiting the present invention. The scope of the invention is defined by the attached claims as well as equivalents thereof. Those skilled in the art can make various replacements and modifications without departing from the scope of the invention, and the various replacements and modifications all fall into the scope of the invention.

What is claimed is:

1. A method for fabricating a semiconductor device structure, comprising:
    forming gate lines on a semiconductor substrate, the gate lines extending in a gate width direction;
    forming gate sidewall spacers surrounding the gate lines;
    forming respective source/drain regions in the semiconductor substrate and on opposite sides of the gate lines in a gate length direction perpendicular to the gate width direction;
    forming conductive sidewall spacers surrounding the gate sidewall spacers; and
    cutting off the gate lines, the gate sidewall spacers, and the conductive sidewall spacers at predetermined positions to divide the cut gate lines into gates which are separated from each other in the gate width direction and thus electrically isolated from each other, and to divide the conductive sidewall spacers into lower contacts which are separated from each other in the gate width direction and thus electrically isolated from each other.

2. The method according to claim 1, wherein the step of cutting off the gate lines, the gate sidewall spacers, and the conductive sidewall spacers comprises:
    the cutting is performed by reactive ion etching or laser cutting.

3. The method according to claim 1, wherein, if there are shallow trench isolations formed in the semiconductor substrate, the positions of cuts are located above the shallow trench isolations.

4. The method according to claim 1, wherein, in the gate width direction, the distance between adjacent electrically isolated gates is 1-10 nm, and the distance between adjacent electrically isolated lower contacts is 1-10 nm.

5. The method according to claim 1, wherein the step of cutting off the gate lines, the gate sidewall spacers, and the conductive sidewall spacers is performed after the conductive sidewall spacers are formed and before the front end of line process for the semiconductor device structure is completed.

6. The method according to claim 1, wherein, after or before the step of cutting off the gate lines, the gate sidewall spacers, and the conductive sidewall spacers, the method further comprises:
    depositing a dielectric layer; and
    planarizing the dielectric layer to expose the top of the conductive sidewall spacers or the lower contacts.

7. The method according to claim 1, wherein the lower contacts serve as conductive contacts between outside and the source/drain regions of semiconductor devices.

8. The method according to claim 1, wherein, after the conductive sidewall spacers are formed and before the cutting is performed, the method further comprises:
    removing the gate lines so as to form openings inside the gate sidewall spacers; and
    forming replacement gate lines in the openings
    wherein the cutting off the gate lines comprises cutting the replacement gate lines.

9. The method according to claim 8, wherein, before the replacement gate lines are formed, the method further comprises:
    forming a gate dielectric layer in the openings.

10. The method according to claim 1, wherein the cutting is performed immediately after the conductive sidewall spacers are follned, so as to form the electrically isolated gates and the electrically isolated lower contacts; and
    wherein the method further comprises:
        removing the gates so as to form openings inside the gate sidewall spacers; and
        forming replacement gates in the openings.

11. The method according to claim 10, wherein, before the replacement gates are formed, the method further comprises:
    forming a gate dielectric layer in the openings.

12. The method according to claim 6, wherein, after the gate lines, the gate sidewall spacers, and the conductive sidewall spacers are cut off, the method further comprises:
    forming an inter-layer dielectric layer on the dielectric layer; and
    forming upper contacts, which are corresponding to the gates and the lower contacts, in the inter-layer dielectric layer, wherein the lower contacts face the upper contacts.

13. The method according to claim 2, wherein, after the conductive sidewall spacers are formed and before the cutting is performed, the method further comprises:
    removing the gate lines so as to form openings inside the gate sidewall spacers; and
    forming replacement gate lines in the openings,
    wherein the cutting off the gate lines comprises cutting off the replacement gate lines.

14. The method according to claim 2, wherein the cutting is performed immediately after the conductive sidewall spacers are formed, so as to form the electrically isolated gates and the electrically isolated lower contacts; and
    wherein the method further comprises:
        removing the gates so as to form openings inside the gate sidewall spacers; and
        forming replacement gates in the openings.

* * * * *